United States Patent [19]

Baldwin et al.

[11] Patent Number: 4,868,500
[45] Date of Patent: Sep. 19, 1989

[54] METHOD FOR DETERMINING PROPERTIES OF LIQUID-CONTAINING POROUS MEDIA USING NUCLEAR MAGNETIC RESONANCE IMAGING

[75] Inventors: Bernard A. Baldwin; James P. Johnson, both of Bartlesville, Okla.

[73] Assignee: Phillips Petroleum Company, Bartlesville, Okla.

[21] Appl. No.: 204,062

[22] Filed: Jun. 8, 1988

[51] Int. Cl.$^4$ ............................................. G01R 33/20
[52] U.S. Cl. .................................... 324/307; 324/318
[58] Field of Search ............... 324/300, 303, 307, 309, 324/318, 321, 322

[56] References Cited

U.S. PATENT DOCUMENTS

| | | | |
|---|---|---|---|
| 4,022,276 | 5/1977 | Dreher et al. | 324/303 |
| 4,077,002 | 2/1978 | Erwine et al. | 324/321 |
| 4,291,271 | 9/1981 | Lauffer | 324/307 |
| 4,389,613 | 6/1983 | Brown | 324/303 |
| 4,424,487 | 1/1984 | Lauffer | 324/307 |
| 4,493,039 | 1/1985 | Gregory | 364/414 |
| 4,542,343 | 9/1985 | Brown | 324/307 |
| 4,595,878 | 6/1986 | Bradshaw | 324/303 |
| 4,649,483 | 3/1987 | Dixon, Jr. | 364/422 |
| 4,671,102 | 6/1987 | Vinegar et al. | 73/61.1 R |
| 4,728,892 | 3/1988 | Vinegar et al. | 324/303 |
| 4,769,602 | 9/1988 | Vinegar et al. | 324/303 |

OTHER PUBLICATIONS

Baldwin, B. A. et al., "Detecting Fluid Movement and Isolation in Reservoir Cores Using Medical NMR Imaging Techniques", Society of Petroleum Engineers/-Department of Energy 14884, SPE/DOE Fifth Symposium on Enhanced Oil Recovery (1986), pp. 39-42 and Figures.
Baldwin, B. A. et al., "Determining Fluid Saturation Distribution in Cores Using NMR Imaging", *The Log Analyst*, vol. 28, No. 2 (Mar.-Apr. 1987), p. 194.
Timur, A., "Pulsed Nuclear Magnetic Resonance Studies of Porosity, Movable Fluid, and Permeability of Sandstones", *Journal of Petroleum Technology*, (Jun. 1969) pp. 775-786.
Brown, R. J. S. et al., "Measurements of Fractional Wettability of Oilfield Rocks by the Nuclear Magnetic Relaxation Method", *Petroleum Transactions, AIME*, vol. 207 (1956), pp. 262-264.
"CSI Applications", General Electric Bulletin, General Electric Company, NMR Instruments, Fremont, Calif.
Bottomley, P. A., "NMR Imaging Techniques and Applications: A Review", *Rev. Sci. Instrum.*, 53(9), (Sep. 1982), pp. 1319-1337.
Andrew, R. E., "NMR Imaging", *Acc. Chem. Res.*, vol. 16 (1983), pp. 114-122.
Fullerton, G. D. et al., "Nuclear Magnetic Resonance Imaging in Biological Systems", *Bio Techniques*, vol. 3, No. 6 (1985), pp. 458-465.
Hassler, G. L. et al., "Measurement of Capillary Pressures in Small Core Samples", *Trans. AIME*, vol. 160 (1945), pp. 114-123.

*Primary Examiner*—Michael J. Tokar
*Attorney, Agent, or Firm*—William R. Sharp

[57] ABSTRACT

A method is provided of determining saturation values corresponding to particular locations in a sample of a porous media, whereby such saturation values can be used in conjunction with corresponding capillary pressures to derive a capillary pressure curve. The method of the invention involves the use of nuclear magnetic resonance (NMR) imaging to obtain NMR intensity values corresponding to the locations of interest. Intensity is related to saturation by an appropriate function which is employed to determine the saturation values from the intensity values.

22 Claims, 6 Drawing Sheets

METHOD FOR DETERMINING PROPERTIES OF LIQUID-CONTAINING POROUS MEDIA USING NUCLEAR MAGNETIC RESONANCE IMAGING

BACKGROUND OF THE INVENTION

The invention relates generally to a method which employs nuclear magnetic resonance (NMR) imaging to determine properties of liquid-containing porous media, such as a rock core plug. More particularly and according to one aspect, the invention relates to determination of the liquid saturation of a porous media using NMR imaging. According to another aspect, the invention even more particularly relates to a method employing NMR imaging which determines the relationship between saturation and capillary pressure for a liquid-containing porous media. This relationship can be expressed in terms of a function which is sometimes called a capillary pressure curve (i.e. saturation versus capillary pressure).

The capillary pressure curve is a very important and useful tool in hydrocarbon reservoir engineering. Such a curve can be used in reservoir simulation to determine characteristics of a particular reservoir such as, for example, recoverable reserves or the likelihood of success for various enhanced oil recovery processes, such as water flooding.

Capillary pressure curves are most typically determined using the Hassler and Brunner method as described in "Measurement of Capillary Pressures in Small Core Samples", Trans. AIME, vol. 160, pp. 114–123 (1945). This method involves measuring the average saturation of liquid in a core plug at a plurality of different centrifuge speeds. Average saturation is determined from either the weight loss of the core plug after each centrifuge run, or from a measurement of the amount of liquid expelled by the core plug during each run. A capillary pressure curve is then determined utilizing the different average saturation and capillary pressure values corresponding to the various centrifuge speeds.

The Hassler and Brunner method has been widely and successfully practiced in the oil industry to determine capillary pressure curves, but has been found to suffer from several disadvantages. For example, the method requires a number (i.e. five to ten or more) of centrifuge runs which are time consuming (i.e. typically one to several hours per run) to carry out, and the method can give inaccurate results due to the fact that saturation at any given point (corresponding to a particular pressure) in the core is not known. Only average saturation is known. Therefore, approximations must be used which require a number of assumptions, including uniform displacement of the liquid, core homogeneity and 100% saturation at one end of the core, which are not necessarily valid. Furthermore, if average saturation is determined by the weight loss technique, which requires weighing, cleaning and resaturation of the core plug after each centrifuge run, the core plug is subjected to a great deal of handling which can cause loss of grains from the core plug during testing with a consequent unknown effect on core characteristics such as pore volume. This can further contribute to inaccuracy of the final results.

SUMMARY OF THE INVENTION

It is, therefore, an object of the invention to provide a method for accurately determining the liquid saturation at a given point in a sample of a porous media.

It is also an object of the invention to provide a centrifuge method for determining the relationship between saturation and capillary pressure for such a sample which employs accurately determined saturation values at different locations in the sample, and which minimizes the number of centrifuge runs, time requirements, and handling of the sample.

The above objects are realized by a method comprising the steps of: substantially saturating a sample of a porous media with a liquid; subjecting the sample to a substantially constant acceleration, by for example centrifuging, in a predetermined direction with respect to the sample so as to cause at least some of the liquid to flow from the sample, this step being performed for such a time until a state of equilibrium is reached in which liquid flow from the sample terminates, and wherein the sample has a first end and a second end such that the sample extends along an axis in the direction of acceleration from the first end to the second end; positioning the sample adjacent to a nuclear magnetic resonance (NMR) detector; subjecting the sample to a static magnetic field; subjecting the sample during the immediately preceding step to a radio frequency field so as to affect atomic nuclei of the liquid in such a manner as to cause the NMR detector to produce at least one signal having at least one amplitude associated therewith, respectively corresponding to each of a plurality of locations in the sample which are spaced a plurality of different distances from the first end of the sample (distance being measured along lines generally parallel to the above-mentioned axis); determining the saturation corresponding to each of the locations based on the amplitudes of the corresponding signal(s); and determining the capillary pressure corresponding to each of the locations. A plurality of saturation-capillary pressure data pairs result where each data pair includes a saturation value and a capillary pressure value. A function relating saturation and capillary pressure (i.e. capillary pressure curve) can be fitted to these data pairs.

According to another aspect of the invention, there is provided a method for determining liquid saturation for at least one location in a sample which employs NMR imaging as discussed above to produce at least one NMR signal having a certain amplitude, and wherein saturation is related to amplitude by means of a nonlinear function. Saturation for the location can then be determined from this nonlinear function.

Determination of a capillary pressure curve in accordance with the invention is a distinct improvement over the Hassler and Brunner method insofar as the inventive method requires at a minimum only one centrifuge run, thus minimizing time requirement and handling of the sample. Furthermore, the inventive method uses NMR imaging to accurately determine saturations at particular locations in the sample so as to avoid the assumptions and potential inaccuracies inherent in the Hassler and Brunner method.

DETAILED DESCRIPTION OF THE INVENTION

A preferred embodiment of the invention as applied to a core plug will now be described, although it should be understood that the invention is applicable to any porous media.

It is appropriate at this point to define several terms which are used repeatedly through the following description and in the appended claims.

The term "voxel" refers to a volume element in the sample of porous media being tested in accordance with the invention.

The term "function" generally denotes a relationship between two parameters, such as saturation and capillary pressure, which can be expressed as, for example, a mathematical equation or a physical curve.

The term "saturation" is defined as the fraction (i.e. in percent) of pore volume in the porous media which is filled with liquid. A sample which is 100% saturated has all of its pore volume filled with liquid.

The "capillary pressure" at a particular point in a liquid containing sample of porous media which is subjected to an acceleration $\alpha$ in a predetermined direction can be expressed mathematically as $p \propto d$, wherein the sample extends in the direction of acceleration from a first end, at which the capillary pressure can be assumed to be zero, to a second end, where d is the distance (as measured along a line parallel to the acceleration direction) from the first end of the sample to said point, and where $p$ is the liquid density. In actuality, $p$ is a density difference between the liquid and the air in the porous media. However, the density for air can for practical purposes be assumed to be zero.

Figures 1, 2:
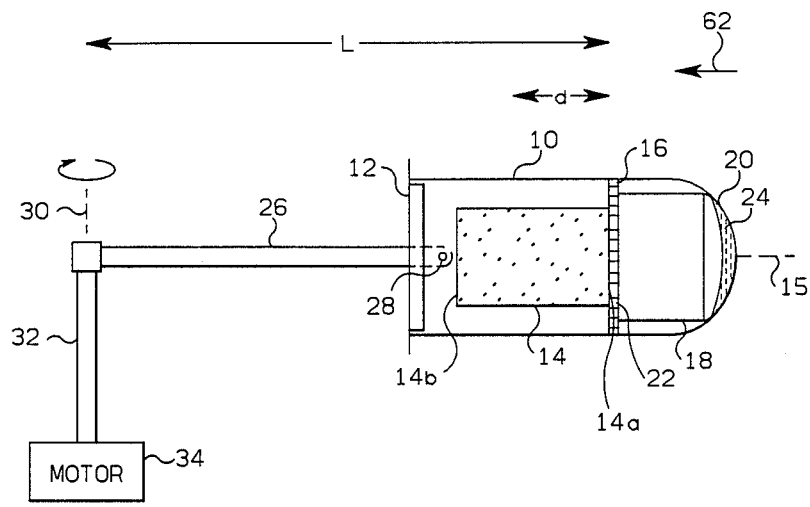
FIG. 1 is a schematic illustration of an apparatus for centrifuging a core plug.
FIG. 2 is a schematic illustration of a nuclear magnetic resonance (NMR) imaging system for use in the present invention.

The apparatus elements for practicing the method of the present invention are schematically illustrated in FIGS. 1 and 2 and are briefly described below.

Referring to FIG. 1, there is shown a centrifuge apparatus which includes a sample holder 10 having removable end closure 12. The apparatus is shown as it would appear during operation. The interior of sample holder 10 is shown as containing a core plug 14 having end 14a and 14b and an axis 15 which passes through each of ends 14a and 14b. In the illustrated embodiment, axis 15 is the longitudinal axis of core plug 14, but it should be understood that as used herein and in the appended claims the term "axis" generally denotes only a line along which the core plug extends between its respective ends, and does not necessarily imply that the core plug is symmetric about such an axis. As shown, core plug 14 is held against an apertured plate 16 by centrifugal force during centrifuging. A tubular member 18 is also provided which is positioned between plate 16 and end 20 of sample holder 10 so as to space plate 16 from end 20. Liquid is allowed to flow from core plug 14 during centrifuging and through apertures 22 so as to collect at end 20 as indicated at 24. Sample holder 10 is pivotally connected to swing arm 26 at pivotal connection point 28 so that sample holder 10 assumes a horizontal position during centrifuging and a vertical position when centrifuging is stopped. Finally, swing arm 26 is driven about a rotational axis 30 by means of drive shaft 32 and motor 34.

Referring now to FIG. 2, the primary elements of an NMR apparatus for use in the invention are schematically shown. The apparatus includes a resistive, permanent or superconducting, preferably superconducting, magnet 35 which produces a static magnetic field $H_0$ in the indicated direction. The apparatus further includes a computer 36 which has the capability of controlling radio frequency transmitter 38 via signal line 39, and which also has the capability of controlling x, y and z gradient power supplies 40a, 40b and 40c and their corresponding gradient coils 42a, 42b and 42c via signal lines 44a, 44b and 44c, respectively. Transmitter 38 is adapted to produce radio frequency signals at a predetermined frequency which are received by RF coil 46 via line 48. RF coil 46 accordingly generates a radio frequency field $H_1$ in a direction perpendicular to $H_0$ and in a predetermined pulse sequence in response to commands from suitably programmed computer 36. The gradient coils produce orthogonal gradient fields which are conventionally controlled by computer 36 so that predetermined voxels in the core plug being analyzed are "scanned".

Also as shown in FIG. 2, a receiver coil 50, comprising a suitable conductor such as copper tubing, is wound around a tubular member 52. Tubular member 52 is preferably composed of a material relatively transparent to radio frequency energy, such as Teflon ® or polyethylene, and is sized to receive core plug 14 in its interior so as to conveniently position the core plug closely adjacent to and generally coaxial with the receiver coil 50. Of course, any means for suitably positioning core plug 14 with respect to receiver coil 50 is within the scope of the invention. It should also be understood that the relative positions of the receiver coil 50, magnet 35, RF coil 46 and gradient coils 42a, 42b and 42c are not necessarily as illustrated, but are rather depicted in FIG. 2 for ease of illustration.

Receiver coil 50 functions as an NMR detector in a manner discussed further below. Signals produced in receiver coil 50 are coupled via leads 56 and 58 to receiver 54 which appropriately amplifies the signals. The amplified signals are digitized by A/D converter 60 and fed into computer 36 for processing.

A commercially available NMR imaging system can be used for the apparatus of FIG. 2. In the case of a medical imager, only the receiver coil needs to be modified as discussed above so as to be closer in size to the core plug being tested to thereby enhance both NMR intensity and homogeneity of the signals.

A preferred embodiment of the method of the invention will now be described.

A core plug is selected which is typically cylindrical in shape and which preferably has end faces generally perpendicular to the plug longitudinal axis.

The core plug is substantially saturated with a liquid of interest, such as for example brine or oil. One method (called "flash saturating") of saturating the core plug involves placing the core plug in a flask, evacuating the flask to a very low pressure, injecting liquid into the flask so as to surround the core plug, and then restoring the flask to atmospheric pressure. This sudden change in pressure tends to force liquid into the pores of the core plug, and typically results in a substantially saturated state of at least 99%. It is preferred that the core plug be as close to 100% saturation as possible. Of course, any alternative technique, such as flow saturation, for saturating the core plug is within the scope of the invention.

After saturating the core plug, it is centrifuged at a predetermined speed, typically in the range of about 500 to about 5,000 RPM, using the apparatus of FIG. 1 so as to subject the core plug 14 to a substantially constant, radial acceleration in a direction as indicated at 62. As shown, direction 62 is toward rotational axis 30. During the centrifuging step, core plug 14 is oriented so as to extend along axis 15 in direction 62 from end 14a to end 14b and so that axis 15 is generally parallel to direction 62. As discussed previously, liquid flows from the plug during centrifuging and collects at end 20 as shown at 24. Centrifuging is performed for such a time until a state of equilibrium is reached wherein liquid flow from the core plug terminates. The time required to reach equilibrium depends upon the composition of the core plug and the centrifuge speed. Typical centrifuge times range from about 1 to about 8 hours.

After centrifuging, the core plug is positioned within tubular member 52, as shown in FIG. 2, so as to be adjacent to and generally centered within receiver coil 50.

The core plug is now subjected to the static magnetic field $H_0$ as produced by magnet 35. Spinning hydrogen nuclei of the liquid act as magnetic dipoles which are caused to align with the static magnetic field such that magnetization vectors associated with the spinning nuclei precess a certain precessional frequency around axes which are parallel to the direction of the static field.

The core plug 14 is now subjected to a radio frequency field $H_1$ as generated by RF coil 46. The frequency selected must be the resonant frequency. That is, the frequency must be equivalent to the precessional frequency of the spinning nuclei so as to achieve resonance. Generally, the radio frequency field is applied to the core plug as a pulse or sequence of pulses only a few milliseconds in duration. The presently preferred pulse sequence is the Hahn spin echo sequence which is illustrated in FIG. 3.

Figure 3:
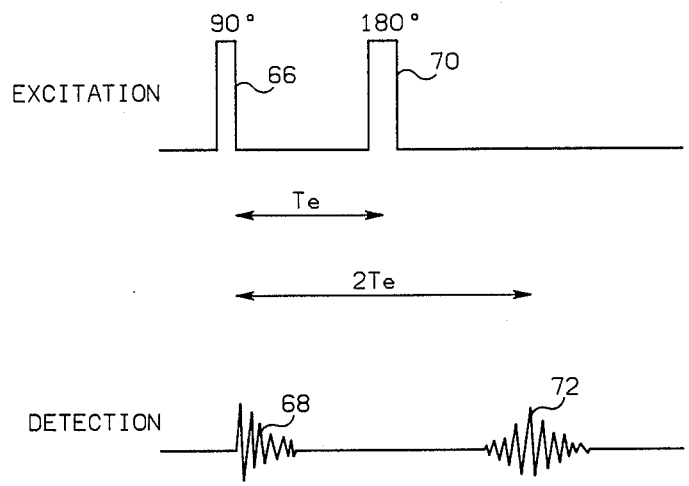
FIG. 3 depicts a radio frequency pulse sequence and detected signals according to one embodiment of the invention.

Referring to FIG. 3, a pulse 66 is applied of sufficient amplitude and duration to cause the precessional axes of the precessing nuclei to rotate 90° to a nonequilibrium, excited state which causes a voltage to be induced in the receiver coil. The resulting signal is shown at 68, which is sometimes called an FID (free induction decay) signal. At a time ("spin echo time") $T_e$, typically about 1 to about 60 milliseconds, after pulse 66, a second pulse 70 is applied of sufficient amplitude and duration to cause the precessional axes to rotate another 180° to a nonequilibrium state which causes the production of a single "spin echo" signal 72 at a time $T_e$ after application of the second pulse. The duration of $T_e$ is primarily dependent on pore size. Generally, smaller pore sizes require shorter $T_e$ values. The spin echo signal shown corresponds to a single voxel in the core plug. The plug is scanned using the gradient coils in a conventional manner to obtain spin echo signals corresponding to other voxels in the plug. It is preferable and most convenient, as should become more apparent below, to utilize a planar scanning technique, well known to those skilled in the art, whereby a plurality of signals are obtained corresponding to a "slice" of voxels which lie along a plane. Preferably this slice lies along the longitudinal axis of the plug. Referring back to FIG. 2, the signals are digitized by A/D converter 60 and are fed to computer 36 for processing. Amplitudes of each of the spin echo signals are stored in the computer as intensity values representative of amplitude which can be expressed in terms of unitless counts. Hereinafter, in the Detailed Description of the Invention, the term "intensity" will be used rather than "amplitude" since the preferred embodiment described herein is in terms of typical commercial NMR instruments, such as the Picker International unit used in the examples, which give an output in terms of counts.

Although the pulse sequence described above is preferred due at least in part to its relative ease of implementation, other pulses or pulse sequences which produce at least one NMR signal for a corresponding voxel are within the scope of the invention. For example, only a single 90° pulse can be applied resulting in the FID signal. The FID signals for a plurality of voxels can be stored in the computer in a manner similar to that discussed with respect to the spin echo signals. Another alternative is the Carr-Purcell pulse sequence which involves a 90° pulse, followed by several 180° pulses and another 90° pulse. Regardless of the pulse sequence used and resulting NMR signals, the amplitude of such signals and representative intensities can be easily related to saturation in a manner later described.

Figure 4:
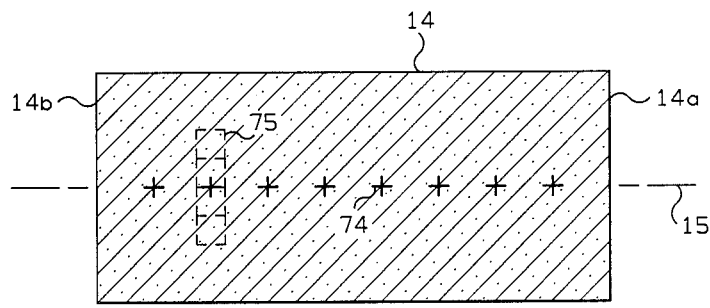
FIG. 4 shows the core plug in cross-section along its longitudinal axis with locations of interest represented by crosses, and voxels corresponding to a particular location represented by dashed lines.

Referring now to FIG. 4, core plug 14 is shown with a plurality of selected locations as 74 represented by crosses. Locations 74 are selected for the determination of corresponding saturation and capillary pressure values. Several voxels 75 associated with a particular location 74 are also shown. These voxels will be further discussed below. Of course, only two dimensions are shown whereas the voxels have a third dimension. Moreover, the illustrated voxels, whose sides are typically only a fraction of a millimeter in length, are not shown to scale for clarity of illustration.

Locations 74 are shown as lying along axis 15 of core plug 14, although these selected locations could lie along a line parallel to but offset from the longitudinal axis. Other spatial arrangements for the selected locations are also within the scope of the invention, as long as the locations are spaced a plurality of different distances from end 14a, wherein distance is measured along lines parallel to axis 15. It will become apparent that by selecting locations spaced different distances from end 14a, the locations have different capillary pressures associated therewith which are employed in a manner discussed in detail hereafter to obtain a capillary pressure curve. The use of locations along the axis as illustrated is preferred in accordance with the invention and has been found to give most accurate results. The liquid "front" resulting from centrifuging tends to show slight curvature for locations closer to the outside surface of the plug. This curvature can lead to some false saturation readings and contribute to inaccuracy of results.

An NMR intensity value corresponding to each location 74 is now determined. Preferably, this is done for a particular location by averaging the NMR intensity values (which are stored in computer 36) for a number of adjacent voxels which define a cluster of voxels centered around the particular location. For example, in the illustrated embodiment, the NMR intensity value for a particular location 74 can be determined by deriving the average of the individual intensity values corresponding to several voxels, as shown at 75, on each side of axis 15. Only four voxels are shown in FIG. 4, but other numbers are also possible which define a cluster centered around the location. Performing such averaging of intensity values to obtain an average intensity value for a particular location tends to correct for local variations in saturation and averages out variations in pore density. Computer 36 can be appropriately programmed to perform such averaging calculations. Although such averaging is preferred, an intensity value for each location can also be determined by simply using the intensity value for a single voxel at that location.

The next step is to determine the relationship between NMR intensity and saturation for the core plug so that saturation values for locations 74 can be determined from the corresponding intensity values. It should be understood that the procedure described below for determining this relationship need not be repeated each time a capillary pressure curve is desired for a particular core plug. For example, once the relationship, or function, is determined for a core plug of a particular lithological type, such as for example sandstone, limestone, or chalk, using a particular saturating liquid and a particular RF pulse sequence, the function so determined can be used to determine saturations corresponding to the core plugs of the same lithological type as long as the same pulse sequence and liquid are employed.

The function, which has been found to be nonlinear, relating saturation and intensity can be determined by obtaining, before saturation of the core plug or after NMR imaging of the core plug, a plurality of average saturation values for the plug and a plurality of corresponding NMR intensity values, whereby a set of saturation-intensity data pairs are obtained wherein each data pair includes a saturation value and a corresponding intensity value. The function is then fitted to the saturation intensity data pairs using any appropriate fitting technique, such as least squares fitting. The average saturation value can be obtained by substantially saturating the core plug with the liquid of interest to result in a saturated state; performing successive desaturations on the core plug to result in a plurality of desaturated states; and then deriving the average saturation values by employing the weight of the core plug in its saturated state, its desaturated states, and in its dry state.

A particular procedure for obtaining the above discussed saturation-intensity data pairs can comprise the following sequence of steps: (1) Clean and dry the core plug. The plug can be cleaned in a suitable solvent, such as methanol if water is the saturating liquid or toluene if oil is the saturating liquid. The core plug is then dried in a vacuum oven to remove residual solvent and preferably cooled in a desiccator. (2) Determine the weight $W_1$ of the dry, substantially liquid free core plug. (3) Saturate the core plug with the liquid of interest to a saturated state near or at 100% saturation. (4) Determine the weight $W_2$ of the saturated core plug. (5) Obtain an average NMR intensity value for the saturated core plug by averaging intensity values for a number of distributed voxels. For example, an average intensity value can be obtained by averaging individual intensities for different clusters of adjacent voxels in a slice, for all voxels in a slice, or for voxels in a number of slices. This average saturation value corresponds to 100% saturation. (6) Partially desaturate the core plug in for example a pressure chamber pressurized with an inert gas. The core plug can be positioned on a porous plate from which liquid flowing from the plug can be collected. (7) Determine the weight $W_3$ of the partially desaturated core plug. (8) Determine the average saturation (in percent) for the partially desaturated core plug from the expression $[(W_3-W_1)/(W_2-W_1)] \times 100$. (9) Obtain an average NMR intensity value, corresponding to the average saturation value determined in (8), in the manner described in (5). (10) Further desaturate the core plug. (11) Repeat steps (7)–(9) with respect to the further desaturated core plug. (12) Repeat steps (10) and (11) a predetermined number of times to result in the desired number of saturation-intensity data pairs.

Figure 5:
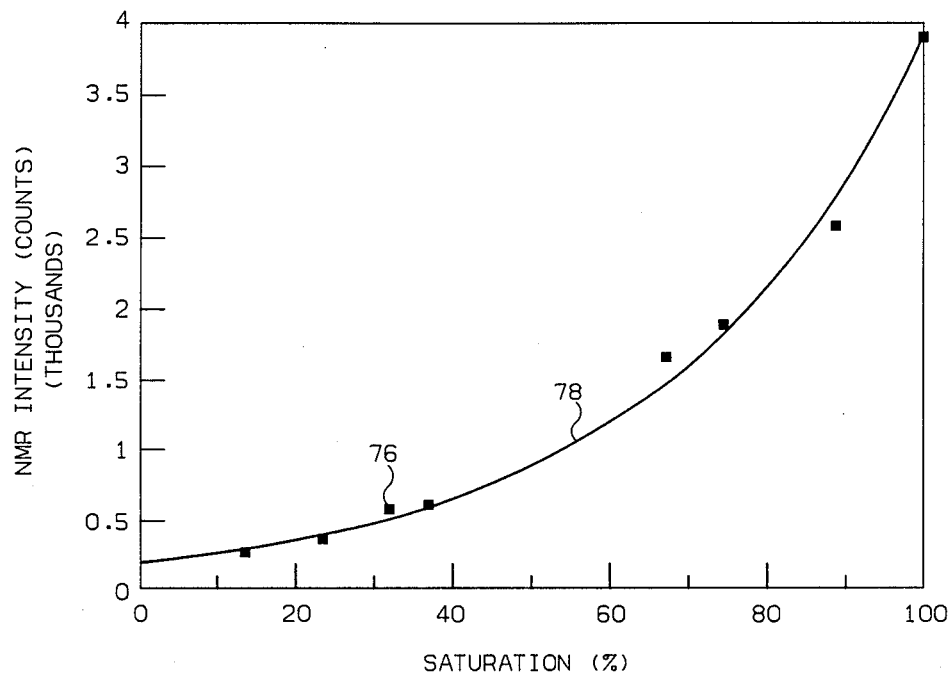
FIG. 5 is a graph of saturation versus NMR intensity for a sandstone core plug as per an example later described.

Referring to FIG. 5, a set of saturation-intensity data pairs so obtained for a Berea sandstone core plug are plotted as indicated at for example 76. A mathematical function fitted to the data pairs is plotted as a curve as shown at 78. The function in this case is a logarithmic function which is discussed in more detail in a subsequent example.

The saturation for each location 74 is now determined from the intensity value corresponding to each location employing the function obtained above. The function can be expressed as a mathematical equation giving saturation S as a function of I, i.e.

$$S=f(I). \quad (1)$$

Therefore, the intensity value for each location can be substituted into this equation to obtain the corresponding saturation value.

Capillary pressure for each location 74 is calculated using the basic expression $\rho \propto d$, where $\rho$ is the density of the liquid, $\propto$ is the acceleration to which the core plug was subjected during centrifuging, and d is the distance (as measured along lines parallel to the core longitudinal axis) from end 14a to the location. Referring back to FIG. 1 the acceleration $\propto$ can be expressed in terms of the angular velocity $\omega$ of the core plug during centrifuging, the distance (as measured parallel to the acceleration direction 62 and axis 15) L between the rotational axis 30 and end 14a of core plug 14, and d to give the following expression for capillary pressure P:

$$P=\rho[(L-d)\omega^2]d. \quad (2)$$

The capillary pressure can be expressed in, for example, psi, dynes/cm$^2$ or newtons/m$^2$. If expressed in dynes/cm$^2$, $\rho$ is in gms/cm$^3$, L and d are in cm, and $\omega$ is in radians/second. Another, and more convenient, expression for capillary pressure P in psi, in terms of a density $\rho$ in gms/cm$^3$ and L and d in cm, can be derived from equation (2) by expressing $\omega$ in terms of centrifuging RPM ($2\pi$RPM/60) and by applying a conversion factor to convert dynes/cm² to psi. Such an expression is given below:

$$P = (1.5908 \times 10^{-7}) \rho (L-d) (RPM)^2 d \qquad (3)$$

It should be noted that acceleration due to gravitational force is generally so minute as compared to α that no correction is needed in this regard.

Therefore, the above determinations of saturation and capillary pressure result in a plurality of saturation-capillary pressure data pairs where each data pair corresponds to a particular location 74 and includes a saturation value and a capillary pressure value.

The data so obtained should be reviewed at this point to see if a sufficiently wide range of capillary pressures were obtained to enable accurate fitting of a capillary pressure curve to the saturation-capillary pressure data pairs. Sufficiency of the data is primarily dependent on R and d (see equation 2). If more data pairs are desired to give better results, it may be desirable to make one, and at most two, more centrifuge run(s) at different centrifuge speeds, and then to perform the other steps described above to give additional saturation-capillary pressure data pairs. It should be apparent however that even if three runs must be made, this is still less than the number of centrifuge runs required by the Hassler and Brunner method, discussed previously.

A function relating saturation and capillary pressure is now fitted to the saturation-capillary pressure data pairs. This function when plotted as a curve is the desired capillary pressure curve for the particular core plug and liquid employed.

Figure 6:
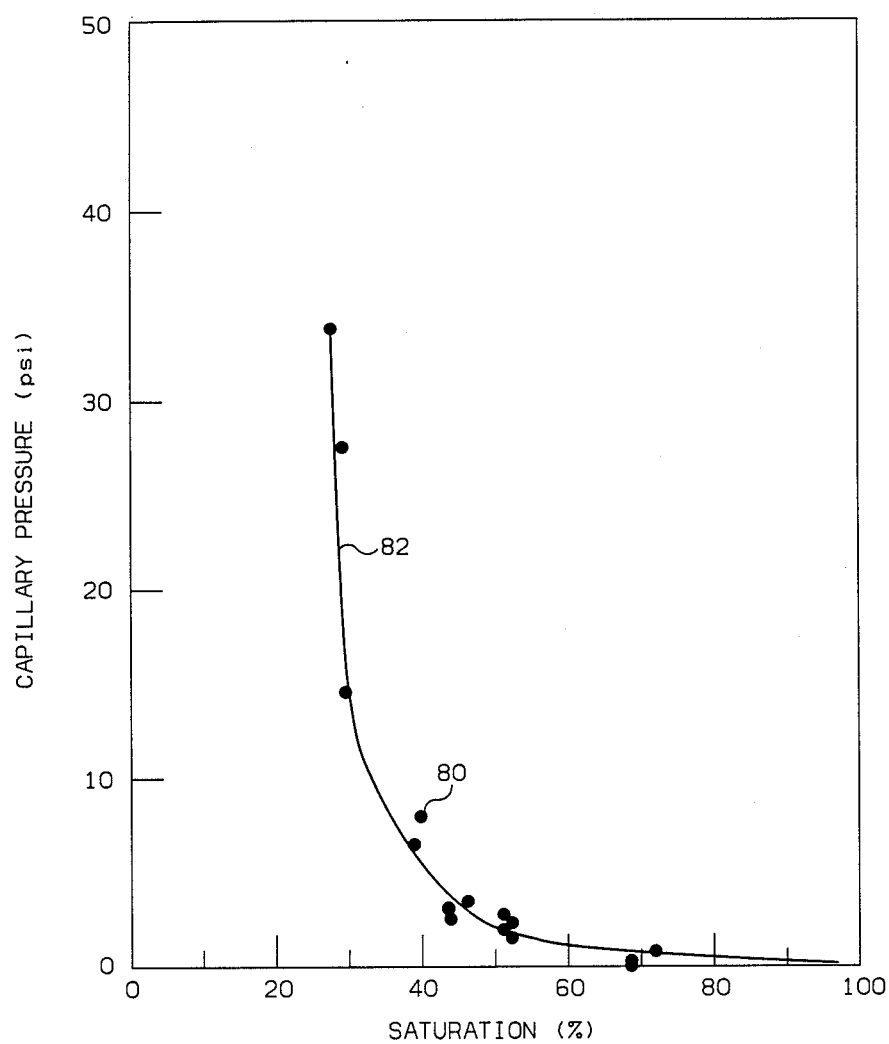
FIG. 6 shows a capillary pressure curve (saturation versus pressure) obtained by the method of the present invention as carried out in the above-mentioned example.

Referring to FIG. 6, saturation-capillary pressure data pairs obtained by the invention for a brine-containing Berea sandstone core plug are plotted, as at for example 80, and the capillary pressure curve as fitted to the data pairs is shown at 82.

It should be understood that any of the above discussed calculations involving calculation of saturation values, capillary pressure values, fitting of functions to data pairs, etc., can be performed by an appropriately programmed computer. Computer 36 could be programmed to perform these calculations, or another computer or microprocessor separate from the NMR apparatus could be used.

Figure 7:
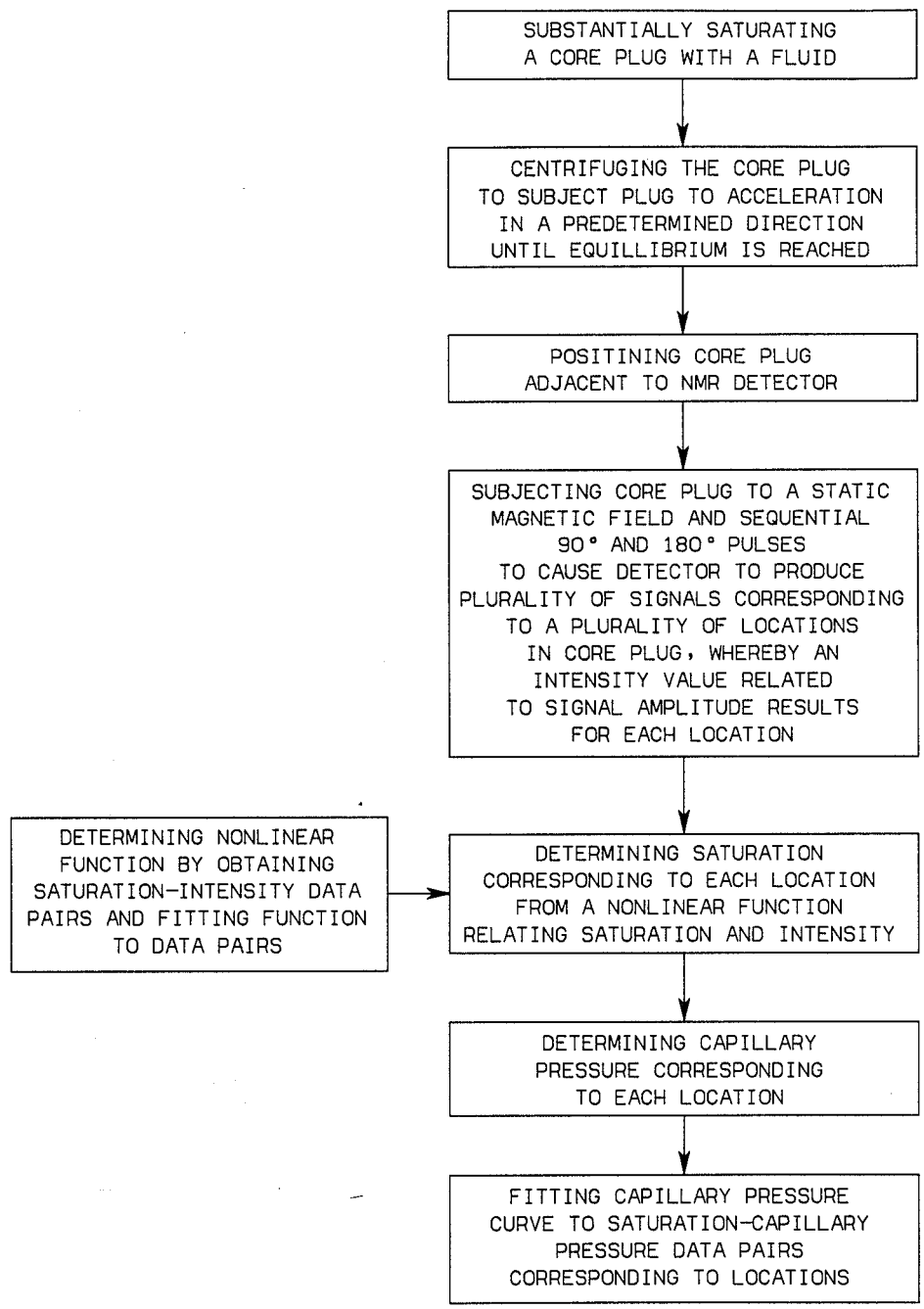
FIG. 7 is a flow chart which sets forth the steps of a preferred embodiment of the invention.

Referring now to FIG. 7, there is shown a flow chart which outlines the various steps of the embodiment of the invention described above. Note that the step of determining the function relating saturation and intensity is shown as an optional step, since this determination may have previously been made for the lithological type of core plug being tested.

Examples will now be set forth to further illustrate the invention, but should not be construed to limit the invention in any manner.

EXAMPLE I

The purpose of this example is to demonstrate the effectiveness of the invention in determining a capillary pressure and curve for a core plug.

A modified Picker International MR VISTA 2055 NMR imaging system, including the components shown in FIG. 2, was employed to gather the necessary NMR data. The commercially available system was modified to have a receiver coil as shown in FIG. 2 which approximates the size of the core plug being tested. Referring to FIG. 2 for clarity of description, receiver coil 50 was 5 inches in length, 2 inches in inside diameter, and consisted of 4.5 turns of ⅛ inch copper tubing. Tubular member 52 was constructed of Teflon® with grooves in its exterior surface for receiving the copper tubing therein. Tubular member 52 was attached to a Plexiglas stand by means of nylon straps, and the stand was positioned so that the receiver coil was approximately centered within RF coil 46. Finally, the Picker International unit employed a superconducting magnet 35.

The various NMR data in the examples was obtained using the Hahn spin echo pulse sequence in a manner described in the Detailed Description with reference to FIG. 3. The important NMR parameters used are given in Table IA.

TABLE IA

| Parameter | Value |
|---|---|
| $T_e$ (Spin Echo Time) | 26 milliseconds |
| $T_r$ (Recovery Time)* | 1,000 milliseconds |
| Voxel Density | 256 × 256 |
| Individual Voxel Size | 0.5 mm × 0.5 mm × 5.0 mm |
| Slice Thickness | 5 mm |
| Field of View (Diameter) | 30 cm |
| Static Field Strength | 0.5 Tesla |
| Gradient Field Strength | 2-3 Gauss/meter |
| RF Frequency | 21.3 MHz |

*Recovery time $T_r$ is the time between pulse sequences which allows the spins to reach a state of thermal equilibrium.

The procedure performed will now be described. In carrying out the procedure, the core plug was placed in a tight fitting, sealed polyethylene bag during periods of inactivity between various steps to assist in preventing evaporation of liquid from the core plug. The core plug was left in the bag during NMR testing since the polyethylene bag is transparent to the radio frequency and magnetic fields utilized.

A core plug of Berea sandstone (about 22% porosity and about 700 millidarcy permeability) having a length of 5 cm and a diameter of 2.5 cm was selected for testing. The liquid of interest used in this example was brine which consisted of 2.0 wt.% sodium chloride and 98.0 wt.% water.

A relationship between saturation and intensity for the core plug was first determined by obtaining a set of saturation-intensity data pairs using the twelve step procedure set forth previously. In step (1), the core plug was cleaned with methanol using a Soxhlet extractor to remove any liquid or solid substances in the pores of the core plug. In step (3), the saturation technique involved evacuating a flask containing the dry core plug to a pressure of less than 100 millitorr, injecting the brine into the flask so as to surround the core plug with brine, and then restoring the flask to atmospheric pressure to thereby saturate the core plug with brine to approximately 100% saturation. This flash saturating technique is highly effective in saturating samples and can be assumed to saturate such a sample to at least 99% saturation or higher. In steps (5) and (9), a single transaxial slice lying along the core longitudinal axis was obtained. An average intensity value corresponding to an average saturation value was determined by selecting three approximately equidistantly spaced generally circular shaped clusters of voxels in the slice such that each cluster contained about 400 voxels and defined a circular area of about 1 cm², averaging the individual intensities for each cluster to give three values, and then averaging these three values to give an overall average intensity value. In steps (6) and (10), pressurized nitrogen was used to desaturate the core plugs. The various steps were repeated to give the plurality of data pairs which are plotted in FIG. 5. A logarithmic function was fitted to the data pairs using the Lotus 1-2-3 program. The function so obtained can be expressed as follows, $$S = (76.80492) \log (I/10^{2.281}) \qquad (4)$$

where the logarithm is a base 10 logarithm. The function is plotted as a curve at 78 in FIG. 5.

Next, the core plug was resaturated with brine using the technique described above. The saturated core plug was then centrifuged at 762 RPM for about 30 minutes using a Sorvall model RB-5-A high speed (maximum 20,000 RPM) centrifuge having a modified sample holder substantially as shown in FIG. 1.

The core plug as sealed in the polyethylene bag was then inserted into tubular member 52 substantially as shown in FIG. 2 so as to be adjacent to and centered with respect to receiver coil 46. Four different transaxial NMR slices were obtained. A particular slice of the four slices was selected for further processing since it appeared to have the least distortion at the edges. Ten locations along the longitudinal axis of the core plug were selected for determination of saturation and capillary pressure values. The locations, or points, were selected to include the major intensities and locations of most rapid change in intensity.

As to determining saturation values, an average intensity value corresponding to each selected location along the core axis was determined. To determine an average intensity value for a particular location, a cluster of adjacent voxels was selected whose outer boundary defines a shape closely resembling an ellipse oriented such that its major axis is perpendicular to the core longitudinal axis and such that its central point (at which the minor and major axes intersect) corresponds to the particular location. This "ellipse" included about 240 voxels and defined a surface area of about 0.6 cm. The individual intensities of the voxels were averaged by the computer to give an average intensity value for the particular location. Average intensity values for the other locations were determined in the same manner. The intensity values obtained above were converted to corresponding saturation values by substituting each intensity value into equation (4) and solving for S.

As to determining capillary pressure values, the pressure at each location was determined using equation (3), where $\rho = 1.016$ gms/cm$^3$, L=11.5 cm, RPM=762 and d equals the distance in cm from end 14a of the core plug to each selected location.

The pressure and saturation values obtained for the centrifuge speed of 762 RPM were reviewed at this point and it was decided to make two further runs at higher speeds of 1254 RPM and 2640 RPM in order to obtain a wider range of saturation-capillary pressure data pairs to thereby enable an optimally accurate fit of the capillary pressure curve to the data pairs. Of course, the procedure for obtaining such data pairs corresponding to the two additional speeds was identical to the procedure carried out with respect to 762 RPM.

The saturation-capillary pressure data pairs and NMR intensity values for the various locations at distance d from end 14a are set forth in Table IB for the three centrifuge speeds.

TABLE IB

| Speed (R) RPM | Distance (d) (cm) | Pressure (P) (psi) | NMR Intensity (I) (counts) | Saturation (S) (%) |
|---|---|---|---|---|
| 762 | 0 | 0 | 1519 | 69.13 |
| 762 | 0.2 | 0.21 | 1519 | 69.13 |
| 762 | 0.8 | 0.78 | 1665 | 72.19 |
| 762 | 1.6 | 1.47 | 926 | 52.62 |
| 762 | 2.2 | 1.88 | 894 | 51.45 |
| 762 | 2.6 | 2.17 | 928 | 52.70 |
| 762 | 3.2 | 2.47 | 719 | 44.19 |
| 762 | 3.6 | 2.66 | 894 | 51.45 |
| 762 | 4.2 | 2.85 | 711 | 43.81 |
| 762 | 4.8 | 3.01 | 711 | 43.81 |
| 1254 | 1.3 | 3.36 | 776 | 46.73 |
| 1254 | 3.0 | 6.44 | 620 | 39.24 |
| 1254 | 4.3 | 7.83 | 636 | 40.09 |
| 2640 | 1.3 | 14.45 | 471 | 30.08 |
| 2640 | 2.8 | 27.54 | 465 | 29.65 |
| 2640 | 4.1 | 33.85 | 443 | 28.03 |

The saturation-capillary pressure data pairs are plotted in FIG. 6. A capillary pressure curve as drawn through the data pairs is shown at 82.

Although three centrifuge runs were performed in this example, it is possible to determine the capillary pressure curve in accordance with the invention from a single centrifuge run with the proper selection of core plug length, longer than the 5 cm used here, and with optimized centrifuge parameters.

EXAMPLE II

The purpose of this example is to demonstrate the effectiveness of using NMR imaging in accordance with the invention to determine saturations corresponding to particular locations in a liquid containing core plug.

A core plug of Berea sandstone was selected having a length of about 7 cm and a diameter of about 2.5 cm, and being further characterized by a porosity of about 22% and a permeability of about 700 millidarcy. The core plug was cleaned and dried as in Example I, except that toluene was used as the cleaning agent. A function relating saturation and intensity was obtained using the procedure of Example I and heptadecane as the saturating liquid.

The core plug was then cleaned and dried, and was cut, or slabbed, into eight ¼ inch discs which were individually weighed to give corresponding dry weights. The discs were flash saturated with heptadecane, and again individually weighed to give corresponding saturated weights. After weighing, the discs were assembled into their original configuration with heptadecane soaked facial tissues between adjacent discs. The so assembled discs were confined in a heat shrink Teflon ® tube, and centrifuged using the apparatus of Example I at 600 RPM for 1.5 hours at ambient temperature and then 2 hours at 10° C. The latter temperature caused the heptadecane to freeze. This freezing was done to assist in preventing redistribution of the heptadecane in the core plug while being transported to the NMR apparatus, which was at a distant location, and during weighing of the discs. (It was later found however that freezing was not really necessary since the liquid did not detectably redistribute in handling and transport. Freezing was not employed in Example I for example.) Each disc was weighed at this point to give a "centrifuged" weight.

The saturation (in %) corresponding to each disc was determined from the expression $[(W_3 - W_1)/(W_2 - W_1)] \times 100$, wherein $W_1$ is the dry weight for each disc, $W_2$ is the saturated weight for each disc, and $W_3$ is the "centrifuged" weight for each disc.

The fully assembled plug was tested after melting with an NMR apparatus substantially like that used in Example I. A single transaxial slice was obtained using the NMR procedure and parameters described in Example I. Individual voxels, about five or six per disc, along the core axis were selected for intensity readings. These individual intensities were converted to saturation values using the function relating saturation and intensity.

Figure 8:
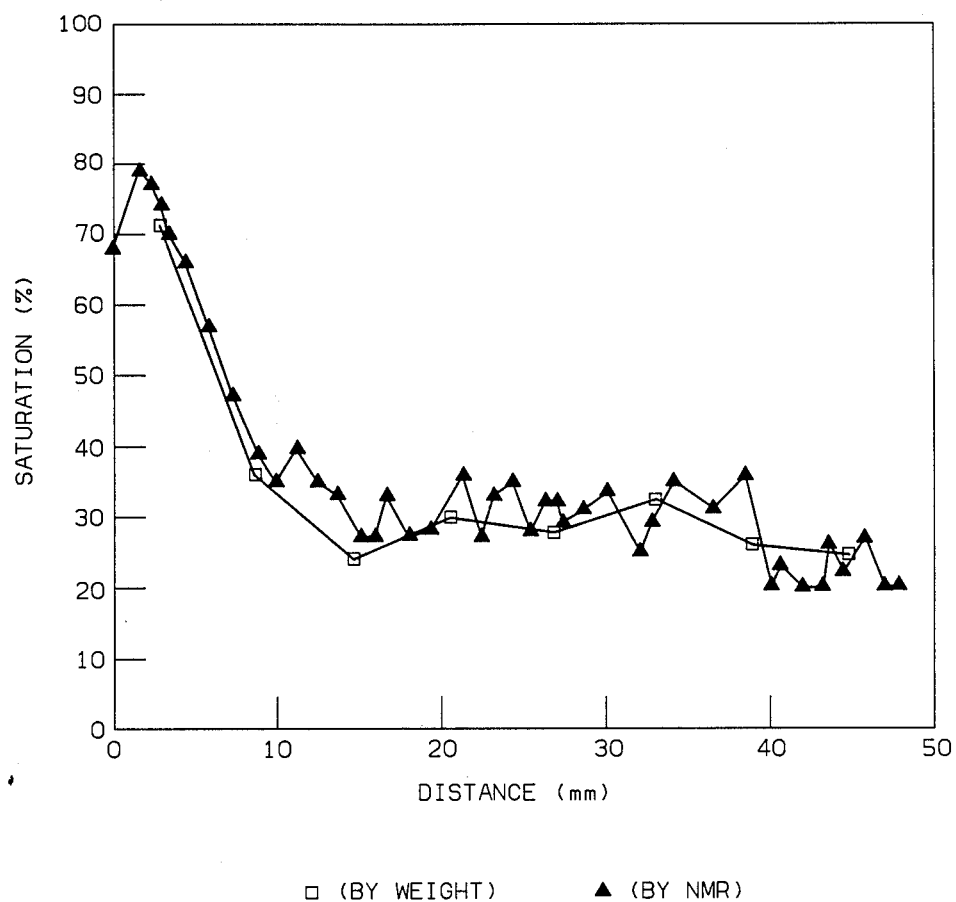
FIG. 8 is a graph of axial location in a core plug versus saturation which shows, as will be described in a subsequent example, the accuracy of saturation values as obtained by certain aspects of the invention corresponding to particular locations in a core plug.

Each saturation value as measured by weighing and by NMR are plotted in FIG. 8 as a function of distance. This distance is the distance as measured parallel to the core longitudinal axis from the bottom end of the core plug (end 14a in FIG. 1) to the point of interest. The saturation values as obtained by NMR are plotted as triangles and the saturation values as obtained by weighing are plotted as squares. Distances were measured to the center of the voxels and discs respectively. The various data points have been connected by straight lines to obtain "curves" for the data.

It can be seen from FIG. 8 that the saturation values obtained in accordance with the invention using NMR compare favorably with those saturations obtained by weighing.

Conclusion

Thus, there is provided by the present invention a method for accurately determining saturations at particular locations in a porous media whereby the saturations can be used in conjunction with corresponding capillary pressures to obtain a capillary pressure curve. The method of the invention is particularly advantageous over conventional techniques for obtaining capillary pressure curves insofar as it eliminates the approximations and mathematical manipulations required by the Hassler and Brunner method, and also requires less centrifuge runs so as to minimize sample handling and time requirements.

Obviously many modifications and variations of the present invention are possible in light of the above teachings. It is therefore to be understood that within the scope of the appended claims the invention may be practiced otherwise than as specifically described.

That which is claimed is:

1. A method comprising
   (a) substantially saturating a sample of a porous media with at least one liquid, wherein said sample has a first end, a second end, and an axis which passes through each of said ends;
   (b) subjecting the sample, after step (a), to a substantially constant acceleration in a predetermined direction with respect to the sample so as to cause at least some of said liquid to flow from the sample, this step being performed for such a time until a state of equilibrium is reached wherein liquid flow from the sample terminates, wherein the sample is oriented during this step so as to extend along said axis in said direction from said first end to said second end and so that said axis is generally parallel to said direction;
   (c) positioning the sample after step (b) in a static magnetic field;
   (d) exposing the thus positioned sample to a pulsed radio frequency field, having a resonant frequency for which nuclear magnetic resonance occurs with respect to atomic nuclei associated with said liquid, such that at least one NMR signal results for each of a plurality of locations in the sample which are spaced a plurality of different distances from the first end of the sample, where distance is defined as being measured along lines generally parallel to said axis and wherein the at least one signal corresponding to each location has at least one amplitude associated therewith;
   (e) detecting said at least one amplitude for each location;
   (f) determining the saturation corresponding to each of said plurality of locations based on said at least one amplitude corresponding to each location; and
   (g) determining the capillary pressure corresponding to each of said plurality of locations.

2. A method as recited in claim 1 wherein steps (f) and (g) yield a plurality of saturation values and capillary pressure values respectively, said method further comprising the step of fitting a first function relating saturation and capillary pressure to a set of data pairs, wherein each data pair corresponds to a particular location and includes a saturation value and a capillary pressure value.

3. A method as recited in claim 2 further comprising the step of plotting said first function as a capillary pressure curve fitted to said data pairs.

4. A method as recited in claim 2 wherein saturation for each said location is determined in step (f) from a second function relating saturation and amplitude.

5. A method as recited in claim 4 wherein the second function is nonlinear.

6. A method as recited in claim 5 wherein the sample is sandstone and the second function is a logarithmic function.

7. A method as recited in claim 5 wherein in step (a) the sample is subjected to sequential radio frequency pulses such that said at least one signal comprises at least one spin echo signal.

8. A method as recited in claim 7 wherein said static magnetic field is in a first direction and said pulsed radio frequency field is in a second direction generally perpendicular to said first direction.

9. A method as recited in claim 8 wherein in step (b) the sample is subjected to said substantially constant acceleration by centrifuging.

10. A method as recited in claim 9 wherein the sample is a core plug having a longitudinal axis which corresponds to said axis which passes through said ends.

11. A method as recited in claim 10 wherein said plurality of locations lie generally along a line which is generally parallel to the longitudinal axis of the sample.

12. A method as recited in claim 11 wherein said line corresponds to the longitudinal axis of the sample.

13. A method as recited in claim 12 wherein each said location corresponds to at least one voxel in the sample.

14. A method as recited in claim 13 wherein each said location corresponds to a cluster of adjacent voxels centered around said location and wherein said at least one signal comprises a plurality of signals, corresponding to said cluster of voxels, having a plurality of corresponding amplitudes.

15. A method as recited in claim 14 further comprising determining said second function by performing the following steps: obtaining, before step (a) or after step (d), a plurality of average saturation values for the sample and a plurality of corresponding average amplitude values for the sample, whereby a set of saturation-amplitude data pairs are obtained where each data pair includes a saturation value and a corresponding amplitude value; fitting the second function to the saturation-amplitude data pairs.

16. A method as recited in claim 15 wherein the average saturation values are obtained by substantially saturating the sample with said liquid to result in a saturated state; performing successive desaturations on the sample to result in a plurality of desaturated states; and deriving the average saturation values by employing the weight of the sample in its substantially saturated state, its desaturated states, and in its dry state wherein it is substantially free of liquid.

17. A method comprising:
(a) providing a sample of a porous media which is at least partially saturated with at least one liquid;
(b) positioning the sample after step (a) in a static magnetic field;
(c) subjecting the thus positioned sample to a pulsed radio frequency field, having a resonant frequency for which nuclear magnetic resonance occurs with respect to atomic nuclei associated with said liquid, such that at least one NMR signal results which corresponds to at least one location in the sample, said at least one signal having associated therewith at least one amplitude;
(d) detecting said at least one amplitude for said at least one location;
(e) obtaining a set of saturation - amplitude data pairs for the sample where each data pair includes a saturation value and a corresponding amplitude value;
(f) fitting a nonlinear function to said data pairs;
(g) determining the saturation corresponding to said at least one location from said nonlinear function based on said at least one amplitude.

18. A method as recited in claim 17 wherein in step (c) the sample is subjected to sequential radio frequency pulses such that said at least one signal produced comprises at least one spin echo signal.

19. A method as recited in claim 18 wherein said static magnetic field is in a first direction and said radio frequency field is in a second direction generally perpendicular to said first direction.

20. A method as recited in claim 19 wherein the sample is a core plug.

21. A method as recited in claim 20 wherein said at least one location corresponds to at least one voxel in the sample.

22. A method as recited in claim 21 wherein said at least one location corresponds to a cluster of adjacent voxels centered around said location and wherein said at least one signal comprises a plurality of signals, corresponding to said cluster of voxels, having a plurality of corresponding amplitudes.

* * * * *